United States Patent
Hong (10) Patent No.: US 9,548,359 B2
(45) Date of Patent: Jan. 17, 2017

(54) METHODS FOR FORMING VERTICAL SEMICONDUCTOR PILLARS

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Zhongshan Hong, Shanghai (CN)

(73) Assignees: Semiconductor Manufacturing International (Beijing) Corporation, Beijing (CN); Semiconductor Manufacturing International (Shanghai) Corporaiton, Shanghai (CN)

(*) Notice: Subject to any disclaimer, the term of this patent is extended or adjusted under 35 U.S.C. 154(b) by 0 days.

(21) Appl. No.: 14/863,400

(22) Filed: Sep. 23, 2015

(65) Prior Publication Data
US 2016/0093693 A1    Mar. 31, 2016

(30) Foreign Application Priority Data
Sep. 26, 2014    (CN) .......................... 2014 1 0500240

(51) Int. Cl.
*H01L 21/76*    (2006.01)
*H01L 29/06*    (2006.01)
(Continued)

(52) U.S. Cl.
CPC ....... *H01L 29/0676* (2013.01); *H01L 21/3065* (2013.01); *H01L 21/3081* (2013.01); *H01L 21/3086* (2013.01); *H01L 21/30625* (2013.01)

(58) Field of Classification Search
CPC ............. H01L 21/3065; H01L 21/3081; H01L 29/0676
(Continued)

(56) References Cited

U.S. PATENT DOCUMENTS

6,204,145 B1 * 3/2001 Noble ............... H01L 21/76264
257/254
6,355,532 B1 * 3/2002 Seliskar ................. B82Y 10/00
257/E21.404
(Continued)

*Primary Examiner* — David S Blum
(74) *Attorney, Agent, or Firm* — Kilpatrick Townsend & Stockton LLP (57) ABSTRACT

A method for forming a semiconductor device includes providing a semiconductor structure, which includes a semiconductor substrate and a first mask layer on the substrate. The first mask layer is used to form a plurality of first trenches that extends into the substrate and extends laterally in a first direction and do not intersect each other. The first trenches are then filled with a fill material. Next, a second mask layer is formed on the semiconductor structure filled with the fill material. The second mask layer is then used to form a second plurality of trenches in the semiconductor substrate that extend laterally in a second direction and do not intersect each other. Each of the second trenches intersects at least one of the first plurality of trenches. Next, the fill material is removed to form a plurality of vertical pillars defined by intersecting first trenches and second trenches.

11 Claims, 9 Drawing Sheets

(51) Int. Cl.
*H01L 21/3065* (2006.01)
*H01L 21/308* (2006.01)
*H01L 21/306* (2006.01)

(58) Field of Classification Search
USPC .......................................................... 438/412
See application file for complete search history.

(56) References Cited

U.S. PATENT DOCUMENTS

| | | | |
|---|---|---|---|
| 2002/0195668 A1* | 12/2002 | Endoh | H01L 27/115 257/390 |
| 2008/0138582 A1* | 6/2008 | Bhandari | B81C 1/00111 428/156 |
| 2009/0230505 A1* | 9/2009 | Dennison | H01L 27/2409 257/522 |

* cited by examiner

METHODS FOR FORMING VERTICAL SEMICONDUCTOR PILLARS

CROSS-REFERENCES TO RELATED APPLICATIONS

This application claims priority to Chinese patent application No. 201410500240.8, filed on Sep. 26, 2014, the content of which is incorporated herein by reference in its entirety.

BACKGROUND OF THE INVENTION

The present invention relates to the field of semiconductor technology. Specifically, embodiments of the invention are directed to semiconductor device structures and manufacturing methods.

Vertical nanowire devices have been used for three-dimensional (3D) memory devices and they can also be used in logic devices. The inventor has observed that, in conventional vertical nanowire devices, the annealing process tends to result in a bending profile.

BRIEF SUMMARY OF THE INVENTION

The inventors have identified drawbacks in the conventional methods for forming vertical nanowire structures, such as bending profiles. Embodiments of the present invention provide a method for forming vertical nanowires without the bending profiles while allowing reduced line edge roughness through annealing. Further, the annealing process can be performed at a higher temperature and/or for a longer period of time to allow more rounded profiles to form circular or elliptical nanowires.

According to some embodiments of the present invention, a method for forming a semiconductor device includes providing a semiconductor structure, which includes a semiconductor substrate and a first mask layer on the substrate. The first mask layer is used to form a plurality of first trenches in the semiconductor substrate that extend laterally in a first direction and do not intersect each other. The plurality of first trenches extends into the substrate. The plurality of first trenches is then filled with a fill material. Next, a second mask layer is formed on the semiconductor structure filled with the fill material. The second mask layer is then used to form a second plurality of trenches in the semiconductor substrate that extend laterally in a second direction and do not intersect each other. Each of the second trenches intersects at least one of the first plurality of trenches. Next, the fill material is removed to form a plurality of vertical pillars defined by intersecting first trenches and second trenches.

In an embodiment of the above method, a rounding process is performed on the plurality of vertical pillars. In an embodiment, the method also includes removing the second mask layer after the rounding process. In an embodiment, each of the plurality of vertical pillars has a curved cross-sectional shape. In an embodiment, the method also includes performing a planarization process such that a top surface of the fill material is substantially flush with a top surface of the first mask layer. In an embodiment, the method also performs a planarization process such that a top surface of the fill material is substantially flush with a top surface of the substrate. In an embodiment, a lateral dimension of each of the vertical pillars is less than 60 nm. In an embodiment, the first mask layer comprises one or more of the following materials: silicon nitride, oxynitride or silicon oxynitride, or silicon carbonitride, and the second mask layer comprises one or more of the following materials: silicon nitride, oxynitride or silicon oxynitride, or silicon carbonitride. In an embodiment, the second direction is different from the first direction.

According to some other embodiments of the present invention, a semiconductor device includes a plurality of substantially vertical semiconductor pillars on a substrate, and a hard mask layer overlying the plurality of semiconductor pillars. A contiguous portion of the hard mask layer connects two or more of the plurality of semiconductor pillars.

In an embodiment of the above device, the hard mask is patterned with multiple parallel portions, each portion overlying and connecting two or more of the plurality of semiconductor pillars. In an embodiment, in plan view, or looking down at the substrate, the outer contour of said semiconductor pillar has a curved shape. In an embodiment, each of the plurality of semiconductor pillars has a portion of a second mask layer disposed thereon; no two portions of the second mask layer are connected to each other. In an embodiment, the mask layer comprises one or more of the following materials: silicon nitride, oxynitride or silicon oxynitride, or silicon carbonitride. In an embodiment, the second mask layer comprises one or more of the following materials: silicon nitride, oxynitride or silicon oxynitride, or silicon carbonitride. In an embodiment, the plurality of semiconductor pillars is disposed in an array of parallel rows and columns. In an embodiment, the plurality of semiconductor pillars forms a plurality of nanowires. In an embodiment, a lateral dimension of the nanowires is less than 60 nm.

The following description, together with the accompanying drawings, will provide further understanding of the nature and advantages of the claimed invention.

DETAILED DESCRIPTION OF THE INVENTION

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

Figure 1:
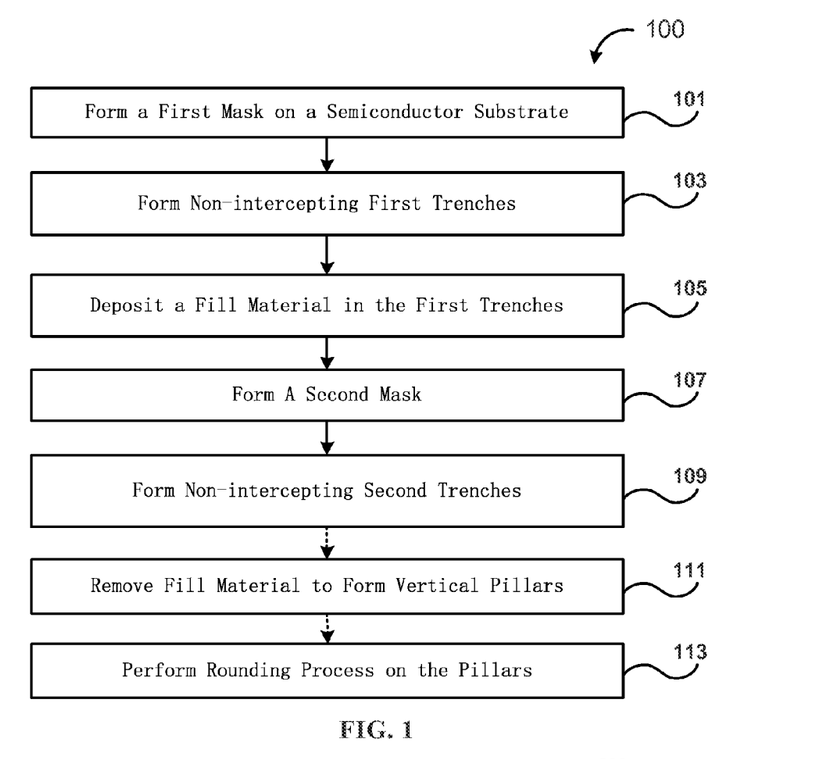
FIG. 1 is a simplified flow chart of a method for forming a semiconductor device according to an embodiment of the present invention.

FIG. 1 is a simplified flow chart of a method for forming a semiconductor device according to an embodiment of the present invention. As shown in FIG. 1, method 100 can be summarized as follows:

Step 101: Form a first mask on a substrate;
Step 103: Form a plurality of first trenches;
Step 105: Deposit a fill material in the first trenches;
Step 107: Form a second mask;
Step 109: Form a plurality of second trenches;
Step 111: Remove the fill material to form vertical pillars; and
Step 113: Perform rounding process.

Figure 2:
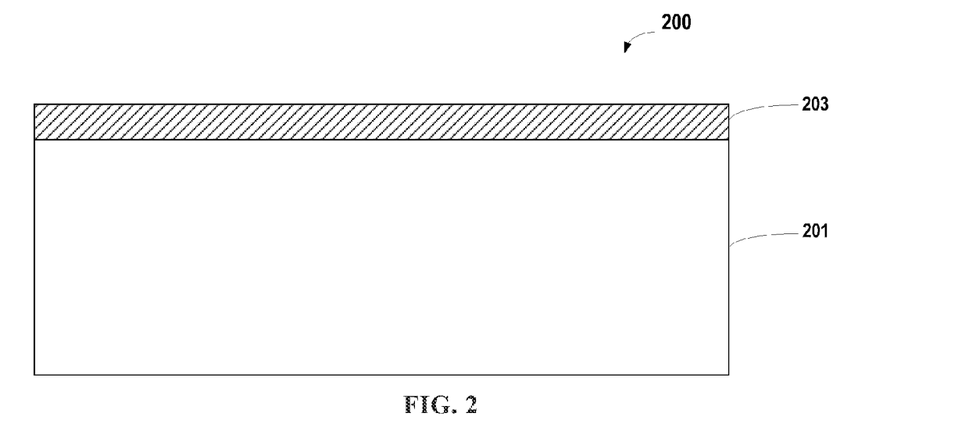
FIGS. 2-12 are cross-sectional view diagrams or top view diagrams illustrating a method for forming a semiconductor device according to embodiments of the present invention.

Method 100 is now explained with reference to view diagrams in FIGS. 2-12. At step 101, a substrate is provided as shown in FIG. 2. In this embodiment, a semiconductor structure 200 includes a substrate 201 and a first mask layer 203 formed on substrate 201. Substrate 201 can include a semiconductor material, for example, a silicon substrate or a silicon-on-insulator substrate (SOI), etc. First mask layer 203 can include a silicon nitride (SiN, more generally, SixNy), silicon nitride oxide, or silicon oxynitride (SiOxNy), or silicon carbonitride (SiCN), etc. Other materials can also be used in the substrate and the mask.

Figure 3A:
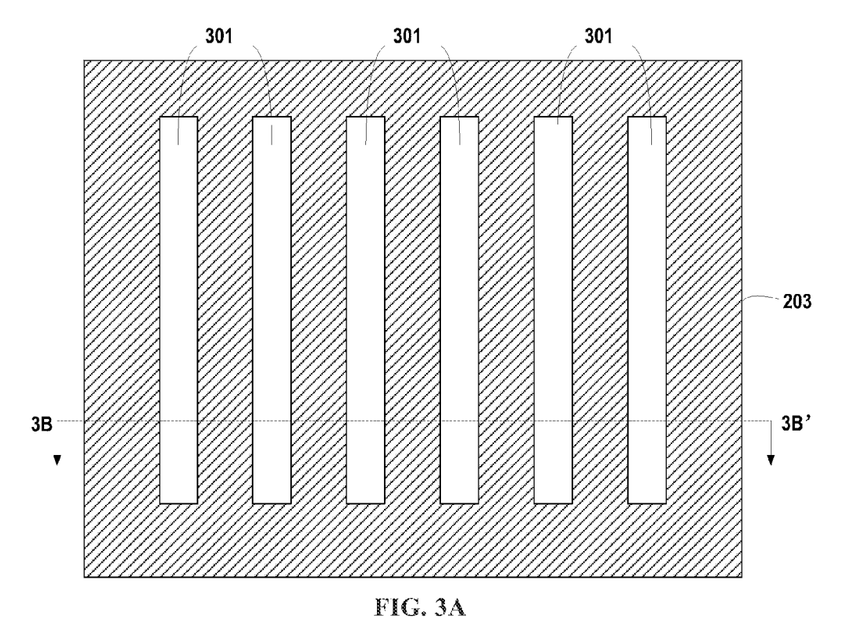
Figure 3B:
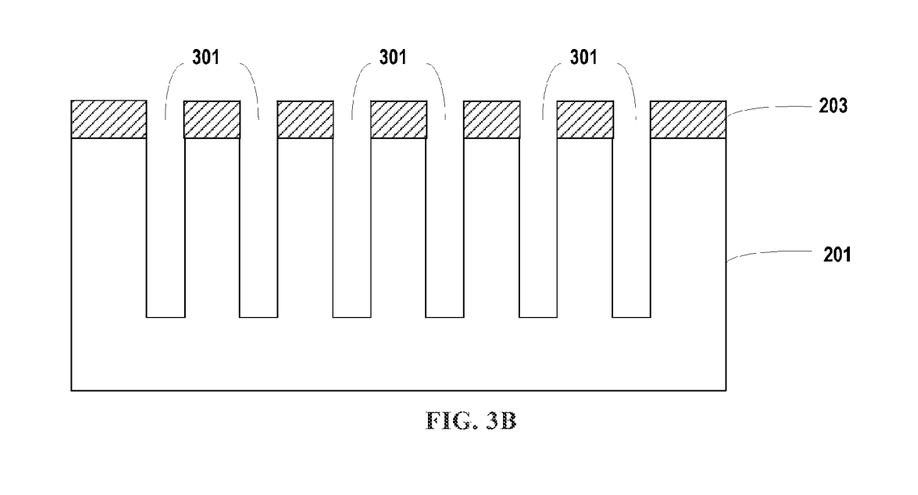

At step 103, a plurality of first trenches is formed in semiconductor structure 200 of FIG. 2. FIG. 3A is a top view and FIG. 3B is a cross-sectional view of first trenches 301 formed in the substrate. As shown in FIG. 3A, the first trenches are parallel to one another. In some embodiments, the first trenches can be non-intersecting, but may not be parallel. In FIG. 3B, the cross-sectional view is taken along line 3B-3B', which extends across the first trenches, as shown in FIG. 3A.

In a specific embodiment, first trenches 301 can be formed using a mask and etch process. First, a patterned resist is formed on the first hard mask layer 203. Then, the patterned resist is used as a mask for etching the first hard mask layer 203 and portions of the substrate material 201 are etched off to form first trenches 301. The etches can be carried out using conventional etching processes, such as anisotropic plasma etch, reactive ion etch (RIE), etc.

Figure 4A:
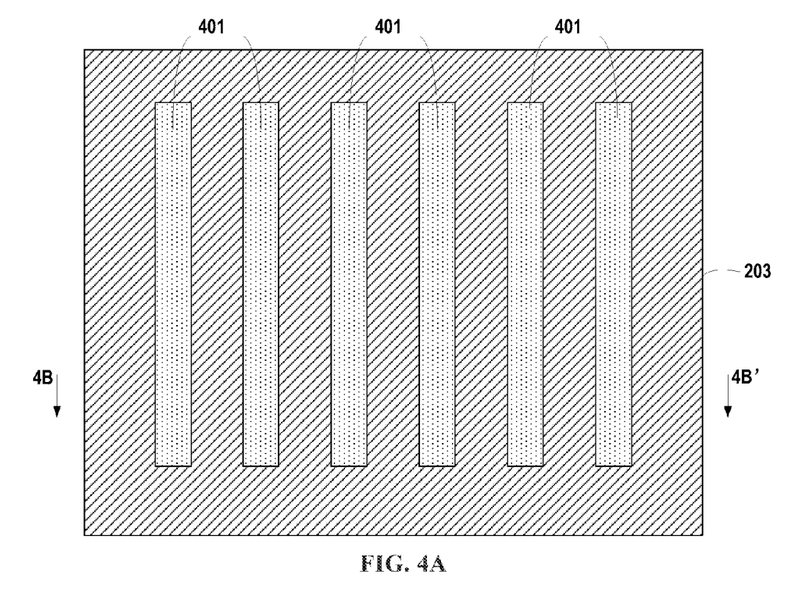
Figure 4B:
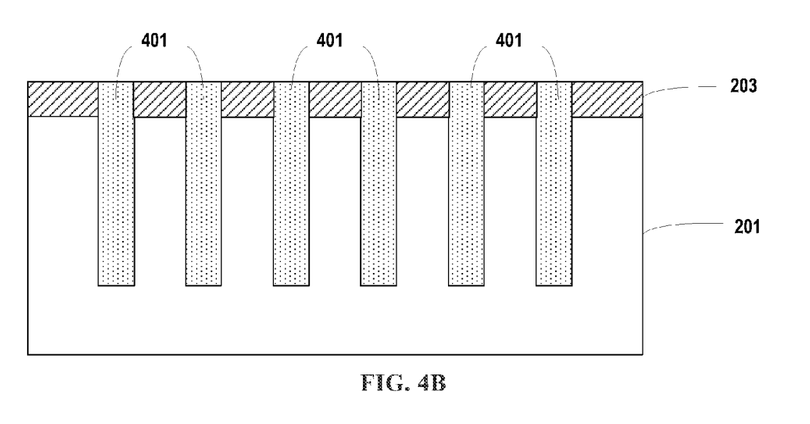

At step 105, first trenches 301 are filled with a filling material 401, as shown in FIGS. 4A and 4B. As used herein, the terms "filling material," "filler material," and "fill material" are used interchangeably. FIG. 4A is a top view of the structure after the filling process, and FIG. 4B is a cross-sectional view taken along line 4B-4B' in FIG. 4A. In some embodiments, filler material 401 may be, for example, silicon oxide. In some embodiments, as shown in FIG. 4B, after filling first trenches 301, the structure is planarized using, for example, chemical mechanical polishing (CMP), so that the upper surface of filling material 401 is substantially flush with the surface of mask layer 203. Note that, in some embodiments, the upper surface of fill material 401 may be below the surface of first hard mask layer 203.

Figure 5:
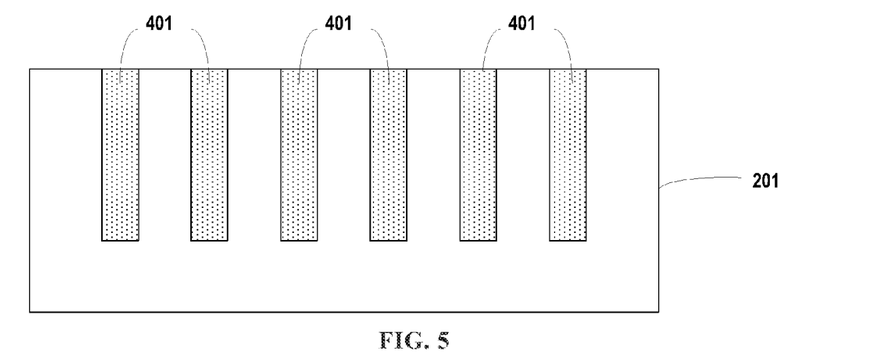

In some alternative embodiments, the planarization process can also remove mask layer 203. As shown in FIG. 5, after the filled first trenches 301 are planarized, the upper surface of the filling material 201 is substantially flush with the upper surface of substrate 201. In this embodiment, after filling the first trench, the first hard mask can be removed. In some other embodiments, the upper surface of filling material 401 may also be below the upper surface of substrate 201. It should be noted that, as known to those skilled in the semiconductor manufacturing process, process variations may be unavoidable. Therefore, as used in this disclosure, "substantially flush" means being flush within the process variations.

Figure 6:
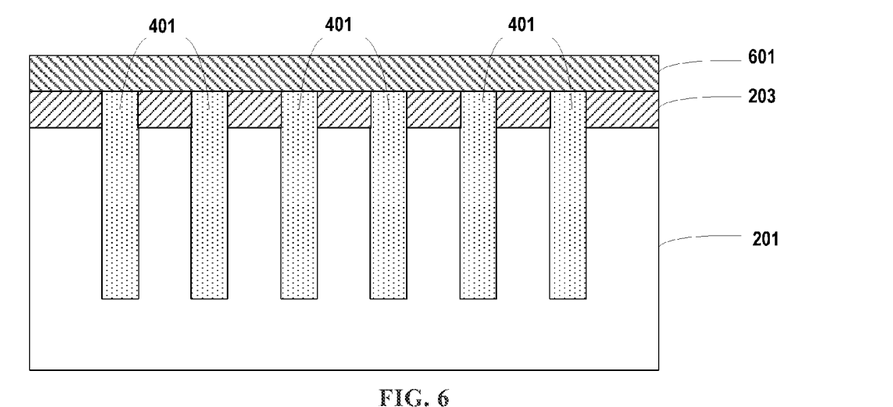

At step 107, as shown in FIG. 6, a second hard mask layer 601 is formed on the substrate structure shown in FIGS. 4A and 5. As an example, the second hard mask layer 601 may be a silicon nitride, oxynitride, or silicon oxynitride, or silicon carbonitride. It should be understood that the material of the second hard mask layer and the material of the first hard mask layer may be the same or different.

Figure 7A:
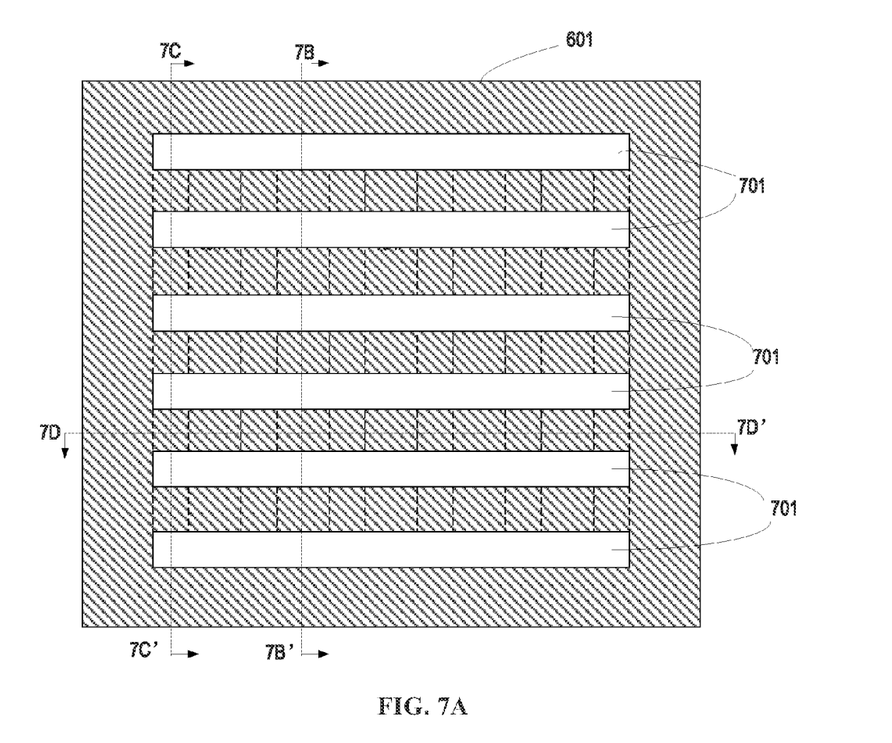
Figure 7B:
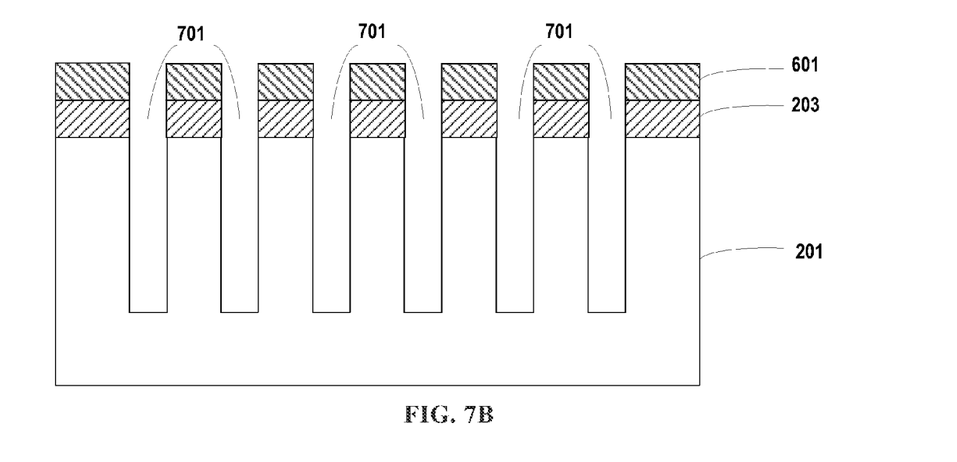
Figure 7C:
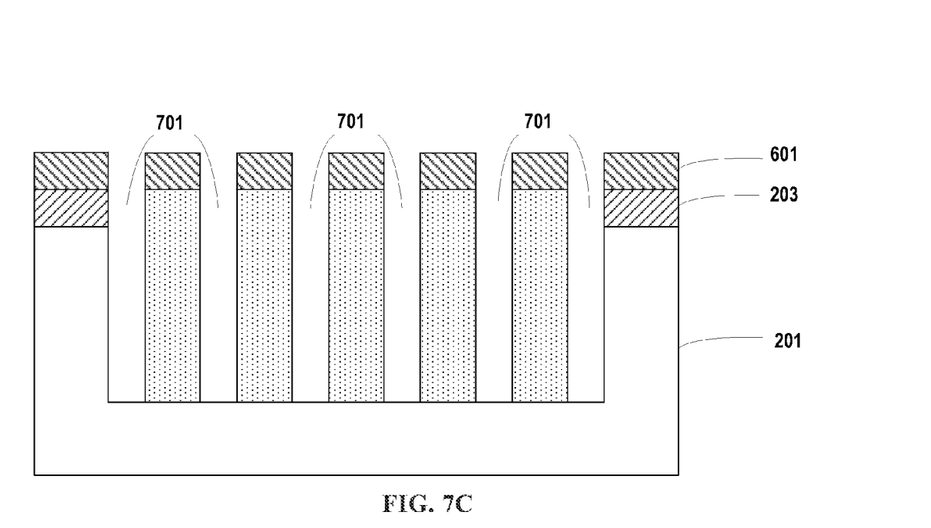
Figure 7D:
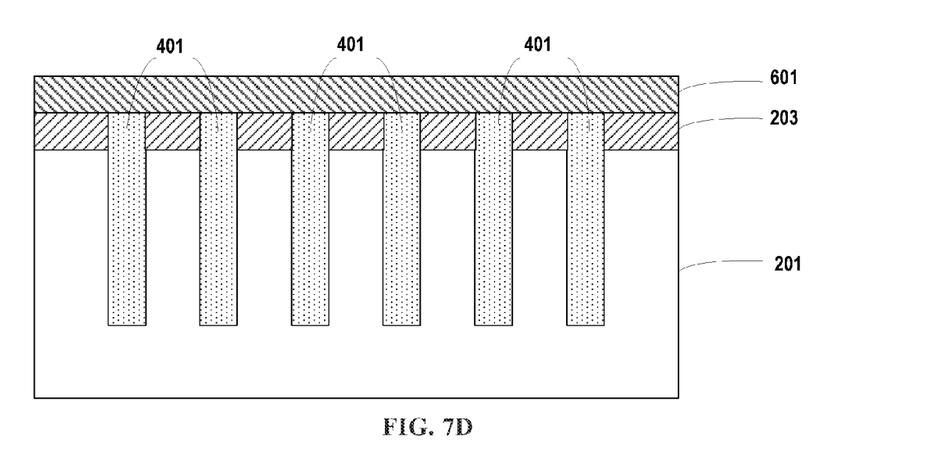

At step 109, a plurality of second trenches is formed using second mask 601 as an etch mask, as shown in a top view in FIG. 7A. In addition, FIGS. 7B-7D are cross-sectional views taken along cut lines 7B-7B', 7C-7C', and 7D-7D', respectively, in FIG. 7A. As shown in FIG. 7A, second trenches 701 are shown being extended substantially along a second direction (i.e., the longitudinal direction of the second trenches), but this is merely an exemplary embodiment. Further, the second direction in FIG. 7A is shown along a substantially horizontal direction in the drawing and parallel to the first direction of first trenches 301. However, the second direction is not so limited. Further, although in FIGS. 7A and 7B, the plurality of second trenches is substantially parallel to one another as shown, but this is merely an example and not intended to be limiting. In some embodiments of the invention, second trenches 701 are configured not to intersect one another. Further, although FIG. 7A shows a second direction being substantially perpendicular to the first direction of first trenches, the present disclosure is not limited thereto. In some embodiments of the invention, each of the second trenches 701 is configured to intersect at least one of the first trenches. As shown in FIGS. 7B and 7C, second trenches 701 extend downward through second hard mask layer 601 into substrate 201.

In a specific implementation, second trenches 701 may be formed using second hard mask layer 601 as an etch mask to etch first hard mask layer 203 (if the aforementioned process is not removed), substrate material 201 and filler material 401 using an etch chemistry that can etch these materials. Alternatively, different etch steps can be carried out using the same mask to etch the different materials using different etch chemistries.

Figure 8A:
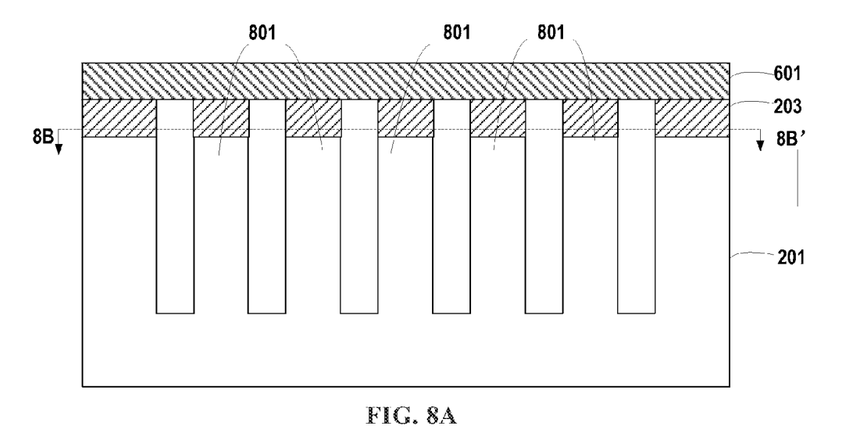
Figure 8B:
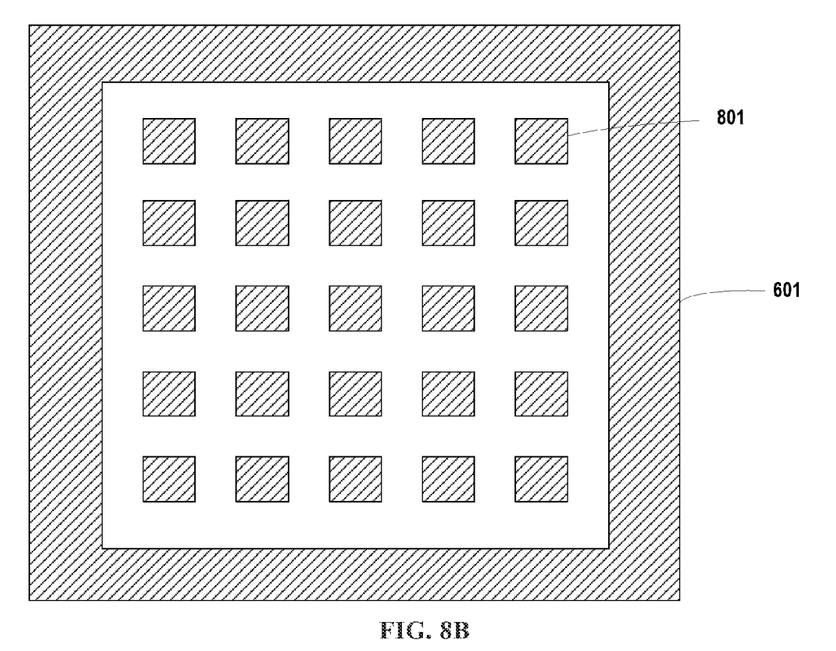

At step 111, fill material 401 is removed, to form semiconductor pillars or posts 801 that are substantially vertical. FIG. 8A is a cross sectional view of semiconductor pillars 801. FIG. 8B is a horizontal cross-sectional view along a cut line 8B-8B' in FIG. 8A. Here, fill material 401 can be etched off. In some embodiments, fill material 401 is a silicon oxide material. In this case, a hydrofluoric acid (HF) solution can be used to remove fill material 401.

In some embodiments, the semiconductor pillar may be a nanowire. As a non-limiting example, the transverse dimension of the nanowire can be less than about 100 nanometers (nm), preferably less than 60 nm. It should be understood that in the present disclosure, the transverse dimension of the nanowire is not intended to limit the scope of the disclosure. Moreover, those skilled in the art will appreciate that, although the examples are directed to nanowires and nanowire arrays and manufacturing, the present invention is not limited thereto.

Figure 9:
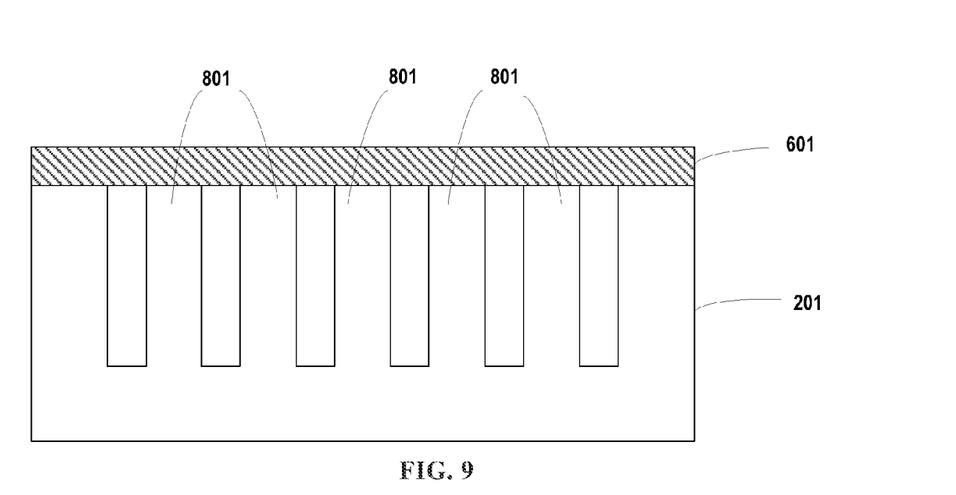

As used herein, the term "vertical semiconductor pillar or nanowire" refers to a semiconductor pillar or nanowire extending in the vertical direction. It will also be appreciated that the array of the semiconductor pillars may comprise one or more semiconductor pillars or columns. In some embodiments, first hard mask layer 203 is disposed on the surface of semiconductor pillar 801, and a second hard mask layer 601 is disposed on first hard mask layer 203. The patterned second hard mask layer 601 on an array of semiconductor pillars 801 form a "bridge" that connects two or more pillars 801, as shown in FIG. 8A. In some other embodiments, such as that described above in connection with FIG. 5, the first hard mask layer 203 has been removed, and only the second hard mask layer 601 is disposed on the upper surface of semiconductor pillars 801 as shown in FIG. 9. Similarly, second hard mask layer 601 on the array of the semiconductor pillar 801 forms a "bridge" that connects two or more second semiconductor pillars.

At step 113, the method includes a pillar rounding process. For example, the semiconductor pillars can be annealed in a temperature range of 800° C. to 1300° C. in order to improve the profile shape. In some embodiments, the above-described annealing may be carried out in an inert gas (e.g., helium He) or reducing gas (e.g., hydrogen gas $H_2$) atmosphere. It should be understood that the above annealing temperature range and annealing atmosphere are exemplary only and not intended to limit the scope of the disclosure. In the rounding or annealing process, the second hard mask layer may serve as a supporting pad for the vertical semiconductor pillars. With the support of the pad, the rounding (e.g., annealing) process can improve the line edge roughness (LER) of the vertical semiconductor pillars. Further, the vertical profile shape of the pillars can be improved; the bending profile shape can be reduced.

Figure 10:
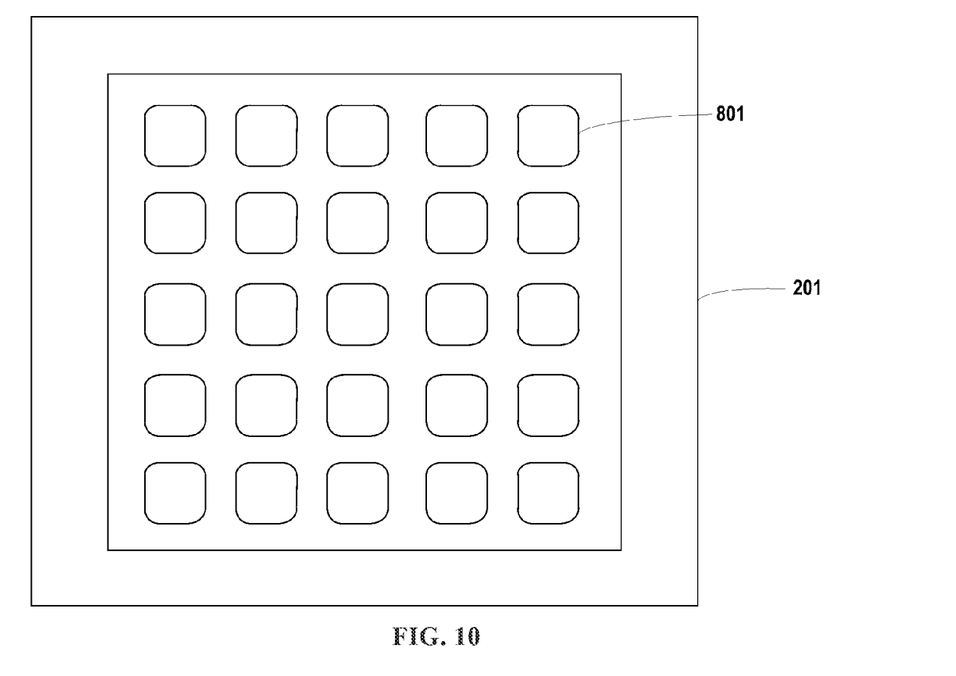
Figure 11:
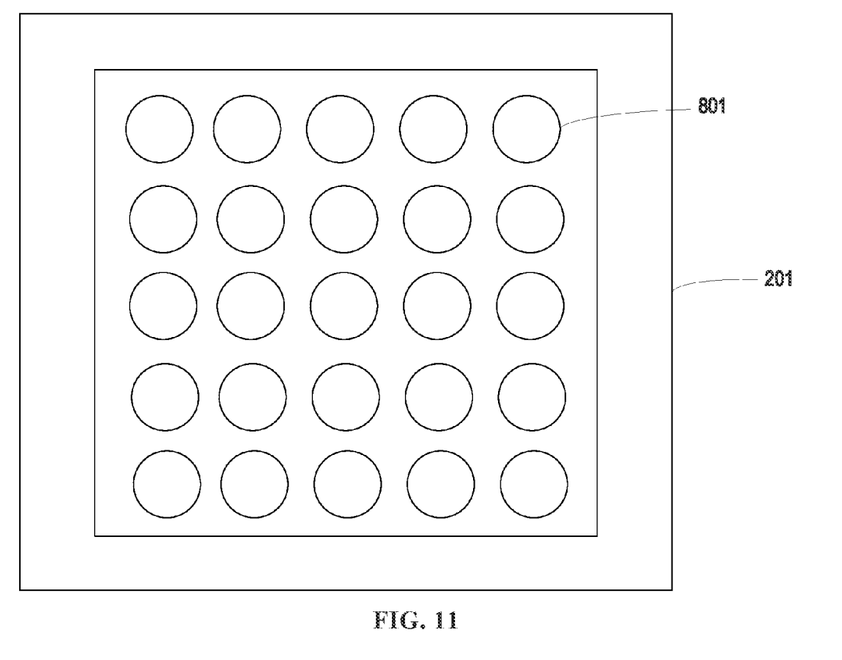
Figure 12:
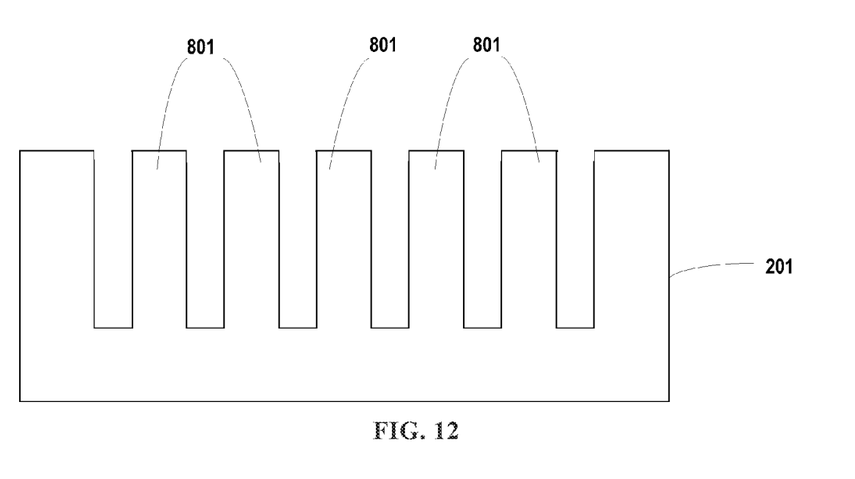

In some embodiments, after etching, the pillars may have a square or rectangular cross-section with sharp corners or edges, as shown in FIG. 8B. After the rounding or annealing process, the sharp edges will be rounded as shown in FIG. 10. In some embodiments, the cross-section of the pillars may be circular or elliptical, etc., as shown in FIG. 11. Further, after the rounding processing, the second hard mask layer can be removed, thereby forming an array of vertical semiconductor pillars as shown in FIG. 12. In the case where the first mask is retained, both the first mask and the second mask can be removed to form an array of vertical semiconductor pillars as shown in FIG. 12.

According to some embodiments of the present invention, a semiconductor device includes a fin structure of a first semiconductor material on a substrate According to some embodiments of the present invention, a semiconductor device Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure

What is claimed is:

1. A method of manufacturing a semiconductor device, the method comprising:
providing a semiconductor structure, which includes a semiconductor substrate and a first mask layer on the substrate;
using the first mask layer to form a plurality of first trenches in the semiconductor substrate that extend laterally in a first direction and do not intersect each other, the plurality of first trenches extending into the substrate;
filling the plurality of first trenches with a fill material;
forming a second mask layer on the semiconductor structure filled with the fill material; and
using the second mask layer to form a plurality of second trenches in the semiconductor substrate that extend laterally in a second direction and do not intersect each other, each of the second trenches intersecting at least one of the plurality of first trenches; and
removing the fill material to form a plurality of vertical pillars defined by intersecting first trenches and second trenches.

2. The method of claim 1, further comprising performing a rounding process on the plurality of vertical pillars.

3. The method of claim 2, further comprising removing the second mask layer after the rounding process.

4. The method of claim 2, wherein each of the plurality of vertical pillars has a curved cross-sectional shape.

5. The method of claim 1, further comprising performing a planarization process such that a top surface of the fill material is substantially flush with a top surface of the first mask layer.

6. The method of claim 1, further comprising performing a planarization process such that a top surface of the fill material is substantially flush with a top surface of the substrate.

7. The method of claim 1, wherein a lateral dimension of each of the vertical pillars is less than 60 nm.

8. The method of claim 1, wherein:
the first mask layer comprises one or more of the following materials: silicon nitride, oxynitride or silicon oxynitride, or silicon carbonitride; and
the second mask layer comprises one or more of the following materials: silicon nitride, oxynitride or silicon oxynitride, or silicon carbonitride.

9. The method of claim 1, wherein the second direction is different from the first direction.

10. A method of manufacturing a semiconductor device, the method comprising:
providing a semiconductor structure, which includes a semiconductor substrate and a first mask layer on the substrate;
using the first mask layer to form a plurality of first trenches in the semiconductor substrate that extend laterally in a first direction and do not intersect each other, the plurality of first trenches extending into the substrate;
filling the plurality of first trenches with a fill material;
forming a second mask layer on the semiconductor structure filled with the fill material;
using the second mask layer to form a plurality of second trenches in the semiconductor substrate that extend laterally in a second direction different from the first direction and do not intersect each other, each of the second trenches intersecting at least one of the plurality of first trenches;
removing the fill material to form a plurality of vertical pillars defined by intersecting first trenches and second trenches; and performing a rounding process on the plurality of vertical pillars.

11. The method of claim 10, further comprising removing the second mask layer after the rounding process.

* * * * *